US006586883B1

(12) United States Patent
Staub et al.

(10) Patent No.: US 6,586,883 B1
(45) Date of Patent: Jul. 1, 2003

(54) METHOD AND APPARATUS FOR DETECTING INDIVIDUAL TWT HELIX CURRENT FOR MULTIPLE TWT LOADS

(75) Inventors: Theodore John Staub, Newtown, PA (US); Herbert Joseph Wolkstein, Livingston, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/022,905

(22) Filed: Dec. 20, 2001

(51) Int. Cl.[7] .............................. H01J 25/34; H03F 5/38
(52) U.S. Cl. ..................... 315/3.5; 330/43; 324/117 R
(58) Field of Search ........................ 315/3.5, 3.6, 39.3; 330/43; 324/71.3, 105, 117 R, 222, 223, 224, 227

(56) References Cited

U.S. PATENT DOCUMENTS

| | | | | |
|---|---|---|---|---|
| 3,566,180 A | * | 2/1971 | Ewton | .......................... 315/3.5 |
| 3,936,732 A | * | 2/1976 | Modiano | ...................... 330/43 |
| 4,323,853 A | * | 4/1982 | Kurokawa | ..................... 330/43 |
| 4,742,294 A | * | 5/1988 | Gallios | .................... 324/117 R |
| 5,500,621 A | * | 3/1996 | Katz et al. | ...................... 330/43 |

* cited by examiner

Primary Examiner—Hoang Nguyen
(74) Attorney, Agent, or Firm—Townsend and Townsend and Crew LLP

(57) ABSTRACT

A method and apparatus to individually detect the cathode to helix current of multiple TWTs sharing a common cathode to helix voltage supplied by a single HV EPC, which provides the capability to determine which tube has exceeded the limit and to adequately protect each helix structure from destruction due to excessive current. An apparatus for detecting travelling wave tube helix current comprises a capacitor having an input electrically connected to a radio frequency signal, an inductor having an input electrically connected to an output of the capacitor and to an input to a helix of a travelling wave tube, the helix of the traveling wave tube electrically connected to a chassis of the traveling wave tube by an impedance, a resistor having an input electrically connected to an output of the inductor and an output electrically connected to the chassis of the travelling wave tube; and wherein a cathode to helix current of the travelling wave tube may be sensed across the resistor.

12 Claims, 2 Drawing Sheets

METHOD AND APPARATUS FOR DETECTING INDIVIDUAL TWT HELIX CURRENT FOR MULTIPLE TWT LOADS

FIELD OF THE INVENTION

The present invention relates to a method and apparatus to individually detect the cathode to helix current of multiple TWTs sharing a common cathode to helix voltage supply.

BACKGROUND OF THE INVENTION

Travelling wave tubes (TWTs) are used as amplifiers and modulator in a number of high-frequency communications applications, such as satellites. Typically, electrical power is supplied to travelling wave tubes by a device known as a High Voltage Electronic Power Converter (HV EPC). The HV EPCs for some satellite and other communication systems have been designed so that a single power supply is used to provide DC voltages and currents to two or more TWTs. The use of a single HV EPC to supply multiple tubes provides mass and volume reductions compared to having TWTs powered by individual HV EPCs.

To retain this mass and volume reduction, it is typically required that the TWTs share a common cathode to helix potential and a common collector to cathode potential. The sharing of the cathode to helix potential also provides the advantage of minimizing phase differentials between the RF signal outputs of the TWTs, which allows for the combining of the output RF power without deleterious effects on the RF signals amplified by the TWT.

There are several disadvantages to sharing a common cathode to helix voltage, which arise from the fact that any helix current return is also shared by the multiple TWT loads. For example, if the helix current of a tube exceeds it limit, which may occur due to electron beam intercept with the helix, there is no way to tell which of the tubes has exceeded the limit. A more severe problem can occur due to the fact that since the helix current return is shared by the multiple TWT loads, the fault protection limit for the helix current cannot be set at a level that is sufficiently low to adequately protect any one helix structure from destruction due to excessive current.

A need arises for a technique that provides the capability to determine which tube has exceeded the limit and to adequately protect each helix structure from destruction due to excessive current.

SUMMARY OF THE INVENTION

The present invention is a method and apparatus to individually detect the cathode to helix current of multiple TWTs sharing a common cathode to helix voltage supplied by a single HV EPC. The present invention provides the capability to determine which tube has exceeded the limit and to adequately protect each helix structure from destruction due to excessive current.

In one embodiment of the present invention, an apparatus for detecting travelling wave tube helix current comprises a capacitor having an input electrically connected to a radio frequency signal, an inductor having an input electrically connected to an output of the capacitor and to an input to a helix of a travelling wave tube, the helix of the traveling wave tube electrically connected to a chassis of the traveling wave tube by an impedance, a resistor having an input electrically connected to an output of the inductor and an output electrically connected to the chassis of the travelling wave tube; and wherein a cathode to helix current of the travelling wave tube may be sensed across the resistor.

The cathode to helix current of the travelling wave tube may be sensed by an analog telemetry voltage generated across the resistor. A value of the resistor is calibrated so that a desired proportion of the cathode to helix current of the travelling wave tube is routed through the resistor.

In one embodiment of the present invention, a method of detecting travelling wave tube helix current comprises the steps of routing a first portion of a cathode to helix current in a helix of a traveling wave tube through a lossy attenuator electrically connected to the helix, routing a second portion of the cathode to helix current in the helix of the traveling wave tube through a resistor electrically connected in parallel to the lossy attenuator, and sensing the cathode to helix current of the travelling wave tube across the resistor.

The sensing step may comprise the step of sensing the cathode to helix current of the travelling wave tube using an analog telemetry voltage generated across the resistor. The method may further comprise the step of calibrating a value of the resistor so that a desired proportion of the cathode to helix current of the travelling wave tube is routed through the resistor.

In one embodiment of the present invention, an apparatus for individually detecting travelling wave tube helix current of multiple travelling wave tubes sharing a common cathode to helix voltage supply comprises a circuit for each travelling wave tube, comprising a capacitor having an input electrically connected to a radio frequency signal, an inductor having an input electrically connected to an output of the capacitor and to an input to a helix of the travelling wave tube, the helix of the traveling wave tube electrically connected to a chassis of the traveling wave tube by an impedance, a resistor having an input electrically connected to an output of the inductor and an output electrically connected to the chassis of the travelling wave tube, and wherein a cathode to helix current of the travelling wave tube may be sensed across the resistor.

The cathode to helix current of the travelling wave tube may be sensed by an analog telemetry voltage generated across the resistor. A value of the resistor may be calibrated so that a desired proportion of the cathode to helix current of the travelling wave tube is routed through the resistor.

In one embodiment of the present invention, a method of individually detecting travelling wave tube helix current of multiple travelling wave tubes sharing a common cathode to helix voltage supply comprises the steps of for each travelling wave tube, routing a first portion of a cathode to helix current in a helix of a traveling wave tube through a lossy attenuator electrically connected to the helix, routing a second portion of the cathode to helix current in the helix of the traveling wave tube through a resistor electrically connected in parallel to the lossy attenuator, and sensing the cathode to helix current of the travelling wave tube across the resistor.

The sensing step may comprise the step of sensing the cathode to helix current of the travelling wave tube using an analog telemetry voltage generated across the resistor. The method may further comprise the step of calibrating a value of the resistor so that a desired proportion of the cathode to helix current of the travelling wave tube is routed through the resistor.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION OF THE INVENTION

The present invention is a method and apparatus to individually monitor the cathode to helix current of multiple TWTs sharing a common cathode to helix voltage supplied by a single HV EPC. The present invention provides the capability to determine which tube has exceeded the limit and to adequately protect each helix structure from destruction due to excessive current.

Figure 1:
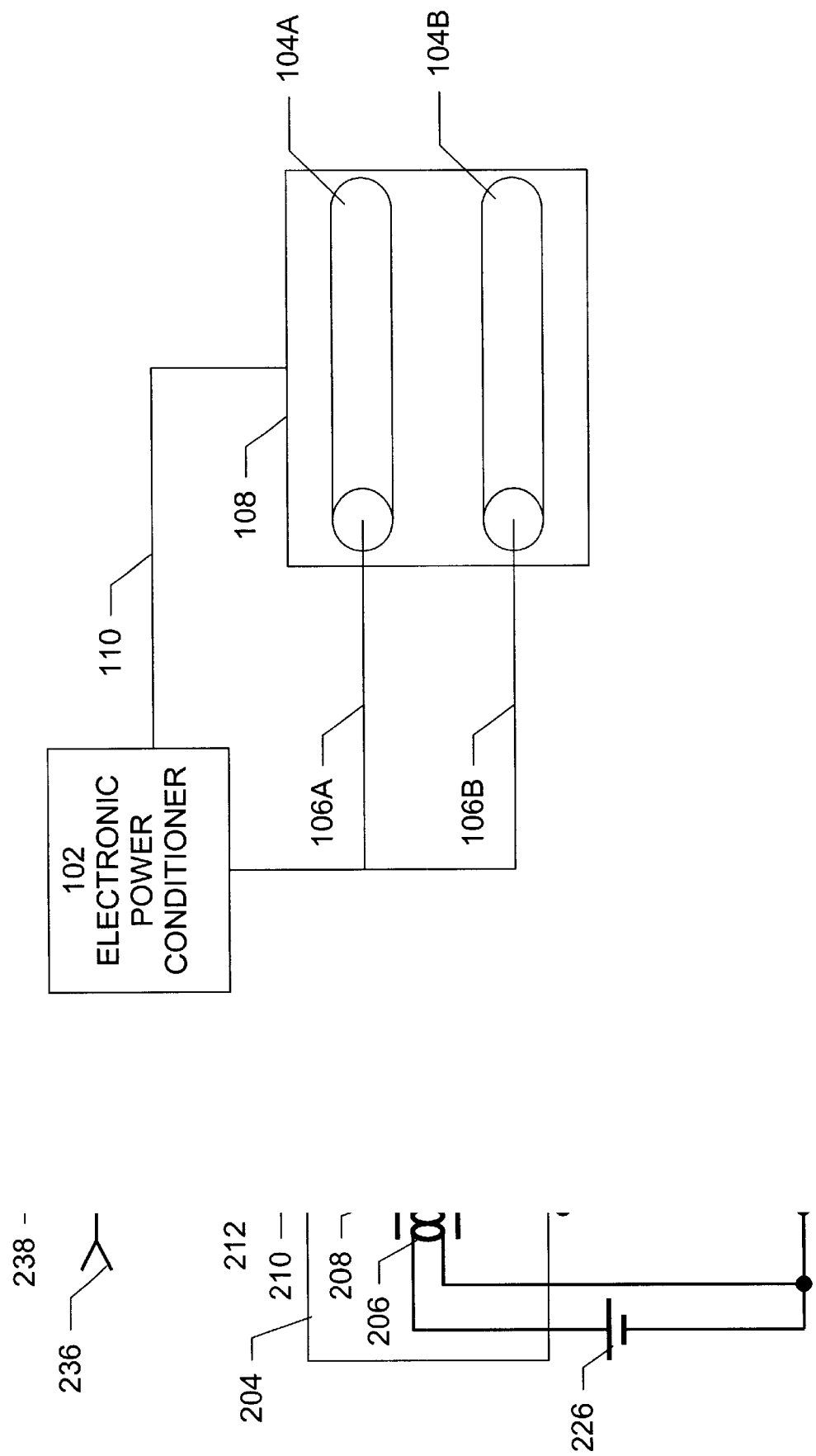
FIG. 1 is an exemplary block diagram of a system incorporating the present invention.

An exemplary system incorporating the present invention is shown in FIG. 1. Included are electronic power conditioner (EPC) 102, and travelling wave tubes 104A and 104B. A single EPC 102, which is typically a high voltage EPC, supplies power to TWTs 104A and 104B over connections 106A and 106B and cathode to helix current is returned through chassis 108 and/or connection 110.

Individual helix current monitoring is made difficult due to the fact that the helix is electrically connected to the TWT chassis. All TWT loads share a common return to EPC 102. In some implementations, such as on a satellite or other spacecraft, chassis 108 may be a satellite panel that provides electrical connection between EPC 102 and TWTs 104A and 104B. Because of this, it is difficult to isolate the helix over-current condition to a particular TWT. This makes it difficult to shut off the electron beam of the specific TWT that has the over-current condition, which could otherwise be done via a beam control grid.

Figure 2:
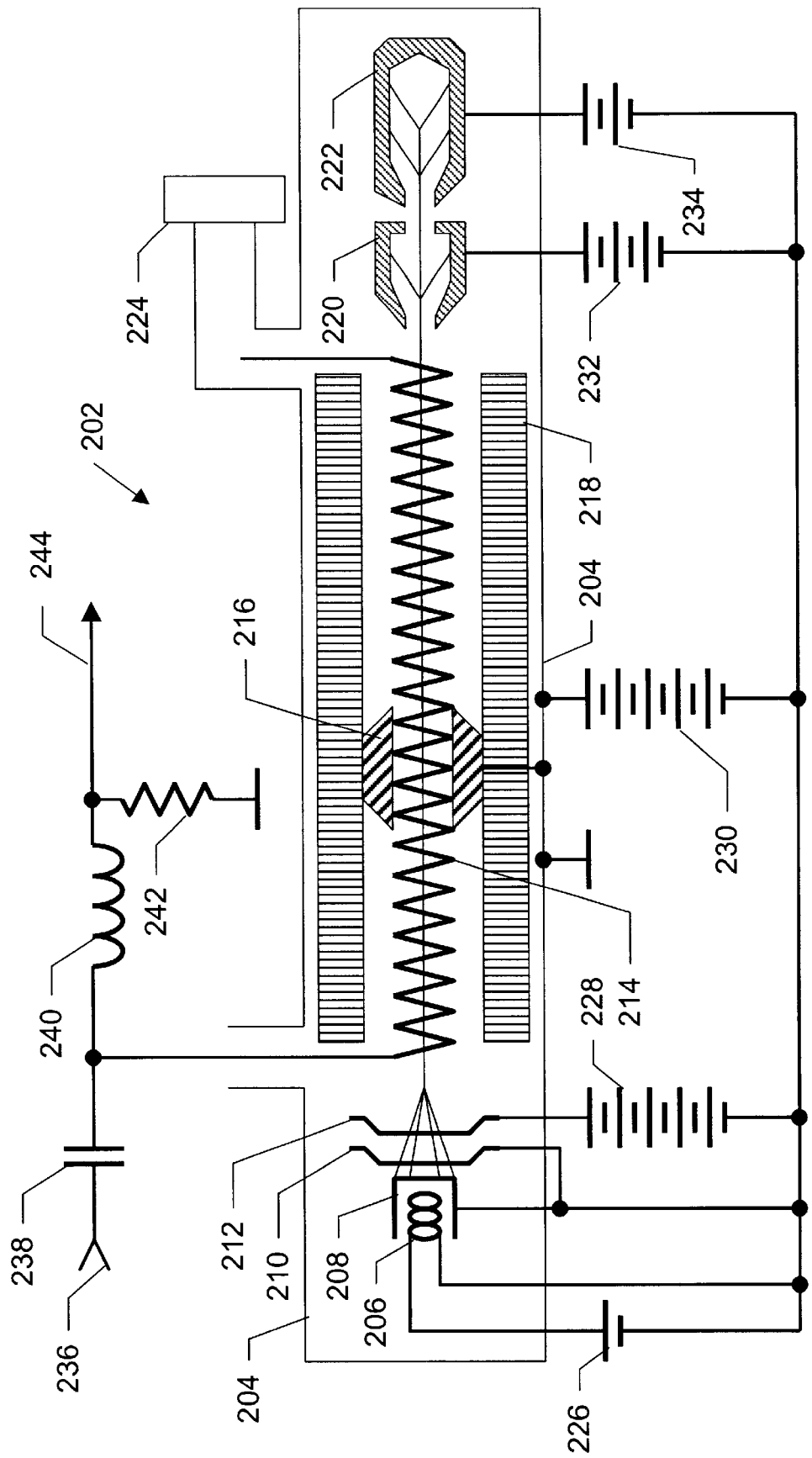
FIG. 2 is an exemplary schematic diagram of a TWT circuit incorporating the present invention.

An exemplary schematic diagram of a TWT circuit incorporating the present invention is shown in FIG. 2. The circuit includes TWT 202, which includes TWT chassis 204, heater 206, cathode 208, first grid (beamforming electrode) 210, second grid (beam acceleration anode) 212, helix 214, lossy attenuator 216, beam focusing system 218, first collector 220, second collector 222, and RF output 224. Although only two collectors are shown, the present invention is applicable to up to TWT designs with any number of collectors. Heater power supply 226 is connected to heater 206, grid bias supply 228 is connected to second grid 212, cathode power supply 230 is connected to cathode 208 and first grid 210, first collector power supply 232 is connected to first collector 220, and second collector power supply 234 is connected to second collector 222. Radio frequency (RF) signal input 236 is connected to DC blocking capacitor 238, which is connected to the input to helix 214 and to inductor 240. Inductor 240 is connected to sense resistor 242 and to telemetry output 244.

Heater 206 heats cathode 208, which generates an electron beam. The electron beam is shaped and controlled by first grid 210 and second grid 212. The electron beam passes through helix 214 and beam focusing system 218 and is collected by first collector 220 and second collector 222. RF signals are input to helix 214, amplified, and output via RF output 224.

Helix 214 is electrically connected to the TWT chassis 204 through lossy attenuator 216, which has a finite impedance. Sense resistor 242 is connected in parallel to the impedance presented by lossy attenuator 216. A consistent and significant portion of the helix current return may be routed through sense resistor 242. This causes a voltage proportional to the helix current to be present across sense resistor 242, which may be sensed at telemetry output 244. This sensed current may be used to prove helix over-current protection using well-known electronic instrumentation techniques.

The helix current detection provided by the present invention requires careful mapping of impedance paths through the TWT attenuator in the TWT structure. In addition, purposeful impedance design is necessary to ensure that the current is accurately routed through the path of sense resistor 242. For example, lossy attenuator 216 typically has an impedance of approximately 20 to 30 ohms, while a typical nominal operational helix current is in the range of approximately 4 to 5 milliamps. Sense resistor 242 must be calibrated so that the desired proportion of the total helix current is routed through sense resistor 242.

In addition, the helix current must be isolated from RF input 236, in order to prevent the flow of helix current to the chassis through the RF connections. This may be accomplished, for example, by an RF bias tee, such as that formed by DC blocking capacitor 238 and inductor 240, placed at the RF input 236, and if necessary at the RF output 224 of the TWT. DC blocking capacitor 238 blocks the DC helix current from flowing through the RF input 236, while allowing the passage of the RF input signal. Inductor 240 blocks much of the RF input signal from appearing at the telemetry output 244, while allowing the passage of the DC helix current, which flows through sense resistor 242.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. An apparatus for detecting travelling wave tube helix current comprising:

a capacitor having an input electrically connected to a radio frequency signal;

an inductor having an input electrically connected to an output of the capacitor and to an input to a helix of a travelling wave tube, the helix of the traveling wave tube electrically connected to a chassis of the traveling wave tube by an impedance;

a resistor having an input electrically connected to an output of the inductor and an output electrically connected to the chassis of the travelling wave tube; and wherein a cathode to helix current of the travelling wave tube may be sensed across the resistor.

2. The apparatus of claim 1, wherein the cathode to helix current of the travelling wave tube is sensed by an analog telemetry voltage generated across the resistor.

3. The apparatus of claim 1, wherein a value of the resistor is calibrated so that a desired proportion of the cathode to helix current of the travelling wave tube is routed through the resistor.

4. A method of detecting travelling wave tube helix current comprising the steps of:

routing a first portion of a cathode to helix current in a helix of a traveling wave tube through a lossy attenuator electrically connected to the helix;

routing a second portion of the cathode to helix current in the helix of the traveling wave tube through a resistor electrically connected in parallel to the lossy attenuator; and sensing the cathode to helix current of the travelling wave tube across the resistor.

5. The method of claim 4, wherein the sensing step comprises the step of:

sensing the cathode to helix current of the travelling wave tube using an analog telemetry voltage generated across the resistor.

6. The method of claim 4, further comprising the step of:

calibrating a value of the resistor so that a desired proportion of the cathode to helix current of the travelling wave tube is routed through the resistor.

7. An apparatus for individually detecting travelling wave tube helix current of multiple travelling wave tubes sharing a common cathode to helix voltage supply comprising:

a circuit for each travelling wave tube, comprising:

a capacitor having an input electrically connected to a radio frequency signal;

an inductor having an input electrically connected to an output of the capacitor and to an input to a helix of the travelling wave tube, the helix of the traveling wave tube electrically connected to a chassis of the traveling wave tube by an impedance;

a resistor having an input electrically connected to an output of the inductor and an output electrically connected to the chassis of the travelling wave tube; and wherein a cathode to helix current of the travelling wave tube may be sensed across the resistor.

8. The apparatus of claim 7, wherein the cathode to helix current of the travelling wave tube is sensed by an analog telemetry voltage generated across the resistor.

9. The apparatus of claim 7, wherein a value of the resistor is calibrated so that a desired proportion of the cathode to helix current of the travelling wave tube is routed through the resistor.

10. A method of individually detecting travelling wave tube helix current of multiple travelling wave tubes sharing a common cathode to helix voltage supply comprising the steps of:

for each travelling wave tube:

routing a first portion of a cathode to helix current in a helix of a traveling wave tube through a lossy attenuator electrically connected to the helix;

routing a second portion of the cathode to helix current in the helix of the traveling wave tube through a resistor electrically connected in parallel to the lossy attenuator; and sensing the cathode to helix current of the travelling wave tube across the resistor.

11. The method of claim 10, wherein the sensing step comprises the step of:

sensing the cathode to helix current of the travelling wave tube using an analog telemetry voltage generated across the resistor.

12. The method of claim 10, further comprising the step of:

calibrating a value of the resistor so that a desired proportion of the cathode to helix current of the travelling wave tube is routed through the resistor.

* * * * *

UNITED STATES PATENT AND TRADEMARK OFFICE
CERTIFICATE OF CORRECTION

PATENT NO. : 6,586,883 B1  Page 1 of 1
DATED : July 1, 2003
INVENTOR(S) : Theodore J. Staub et al.

It is certified that error appears in the above-identified patent and that said Letters Patent is hereby corrected as shown below:

Drawings,
Figure 1,

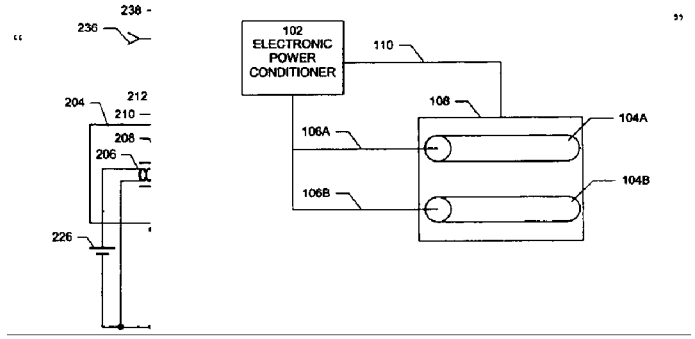

should be replaced with the following:

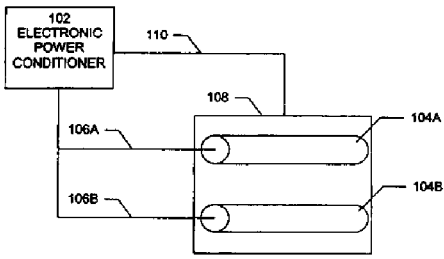

Signed and Sealed this

Twenty-first Day of December, 2004

JON W. DUDAS
*Director of the United States Patent and Trademark Office*